United States Patent
Park et al.

(10) Patent No.: US 8,007,634 B2
(45) Date of Patent: Aug. 30, 2011

(54) WAFER SPIN CHUCK AND AN ETCHER USING THE SAME

(75) Inventors: Joo-Jib Park, Seoul (KR); Woo-Young Kim, Cheonan-si (KR); Woo-Seok Lee, Cheonan-si (KR)

(73) Assignee: Semes Co., Ltd. (KR)

( * ) Notice: Subject to any disclaimer, the term of this patent is extended or adjusted under 35 U.S.C. 154(b) by 97 days.

(21) Appl. No.: 12/053,908

(22) Filed: Mar. 24, 2008

(65) Prior Publication Data

US 2009/0101285 A1 Apr. 23, 2009

(30) Foreign Application Priority Data

Oct. 22, 2007 (KR) .................. 10-2007-0106257

(51) Int. Cl.
*H01L 21/027* (2006.01)
*H01L 21/304* (2006.01)
*B08B 3/00* (2006.01)

(52) U.S. Cl. .................. 156/345.55; 134/119; 134/149; 134/157; 134/902

(58) Field of Classification Search ............. 156/345.55, 156/345; 134/119, 134, 149, 157, 902
See application file for complete search history.

(56) References Cited

U.S. PATENT DOCUMENTS

| 6,179,921 | B1 * | 1/2001 | Ruffell et al. ................. 118/715 |
| 6,536,454 | B2 * | 3/2003 | Lindner ........................ 134/153 |
| 7,288,165 | B2 * | 10/2007 | Polyak et al. ............ 156/345.12 |
| 2004/0065354 | A1 * | 4/2004 | Ishizaki et al. ................ 134/30 |
| 2009/0101285 | A1 * | 4/2009 | Park et al. ................ 156/345.55 |

FOREIGN PATENT DOCUMENTS

| JP | 59154028 A | * | 9/1984 |
| JP | 61042919 A | | 3/1986 |
| JP | 01-125936 | | 5/1989 |
| JP | 08071878 A | * | 3/1996 |
| JP | 11067650 A | * | 3/1999 |
| JP | 2004-134431 | | 4/2004 |

OTHER PUBLICATIONS

Office Action from the Japanese Patent Office for the corresponding Japanese patent application No. 2008-113356, issued Aug. 2, 2010.

* cited by examiner

*Primary Examiner* — Sylvia R. MacArthur
(74) *Attorney, Agent, or Firm* — Myers Bigel Sibley & Sajovec, P.A.

(57) ABSTRACT

A wafer spin chuck and an etcher using the same are provided. According to an aspect of the present invention, there is provide a wafer spin chuck device comprising: a spin body which spins a wafer; and a stationary body which holds the spin body and is under the spin body with a space between the spin body and the stationary body, wherein the stationary body includes a blocking unit which blocks the space with a fluid.

11 Claims, 5 Drawing Sheets

WAFER SPIN CHUCK AND AN ETCHER USING THE SAME

CROSS-REFERENCE TO RELATED APPLICATION

This application claims priority from Korean Patent Application No. 10-2007-0106257 filed on Oct. 22, 2007, in the Korean Intellectual Property Office, the disclosure of which is incorporated herein by reference in its entirety.

BACKGROUND OF THE INVENTION

1. Field of the Invention

The present invention relates to a spin chuck. More particularly, the present invention relates to a spin chunk that blocks a space between a spin body and a stationary body of the spin chuck, and an etcher using the spin chunk.

2. Description of the Related Art

Semiconductor fabrication processes form desired patterns on a semiconductor substrate, a glass panel, or a liquid panel using various processes.

In general, an etching process refers to a process that removes metal layers according to predetermined patterns on a wafer while spinning the wafer. Also, an etching process can be performed on a back of a wafer to remove remaining chemical or abnormal substances.

A spinning operation is performed by spinning a wafer to an order of a thousand RPMs while providing etchant. The spinning operation can be also used in other semiconductor fabrication processes including a cleaning process and a photoresist process.

The wafer can be spinned using a spin body. A wafer can be fixed to a spin body using vacuum absorption, or the edge of the wafer can be mechanically fixed to the side of the wafer.

However, since the wafer spins at a high speed, etching chemicals can be rapidly ejected from the wafer and against a wall of a process chamber. The chemicals can accumulate on the wafer, or can reach the wafer substance at a mechanical operating part that spins the wafer.

This can increase the error rate of the semiconductor fabrication, and as a result yield can be decreased. Therefore, a spin chunk that can prevent a spinning wafer from having abnormal substances and a semiconductor fabrication device using the spin chunk are provided.

SUMMARY OF THE INVENTION

An exemplary embodiment of the present invention is to prevent particle contamination of a wafer from by closing a space between a spin body and a stationary body of a spin chunk that spins the wafer by fluid.

Also, it prevents a spin chunk from corrosion by chemicals by preventing chemicals from penetrating the space between a spin body and a stationary body of the spin chunk.

The present invention should not be construed as being limited to the above object, and the above stated objects as well as other objects, features and advantages of the present invention will become clear to those skilled in the art upon review of the following description.

According to an aspect of the present invention, there is provide a wafer spin chuck device comprising: a spin body which spins a wafer; and a stationary body which holds the spin body and is under the spin body with a space between the spin body and the stationary body, wherein the stationary body includes a blocking unit which blocks the space with a fluid.

According to another aspect of the present invention, there is provide a wafer spin chuck device comprising: a spin body which spins a wafer; and a stationary body which holds the spin body and is under the spin body with a space between the spin body and the stationary body, wherein the stationary body includes at least one of a protrusion part which blocks the space.

According to another aspect of the present invention, there is provide a wafer etcher comprising: a process chamber which provides a space for an etching process; a wafer spin chuck which spins a wafer in the process chamber, wherein the wafer spin chuck includes a spin body which spins the wafer while the wafer is floated by inert gas, a stationary body which is under the spin body with a space between the spin body and the stationary body, and a blocking unit which blocks the space with a fluid; and a chemical supply unit which sprays chemical to a surface of the wafer.

BRIEF DESCRIPTION OF THE DRAWINGS

The above and other features and advantages of the present invention will become apparent by describing in detail exemplary embodiments thereof with reference to the attached drawings in which.

DETAILED DESCRIPTION OF THE INVENTION

Figure 1:
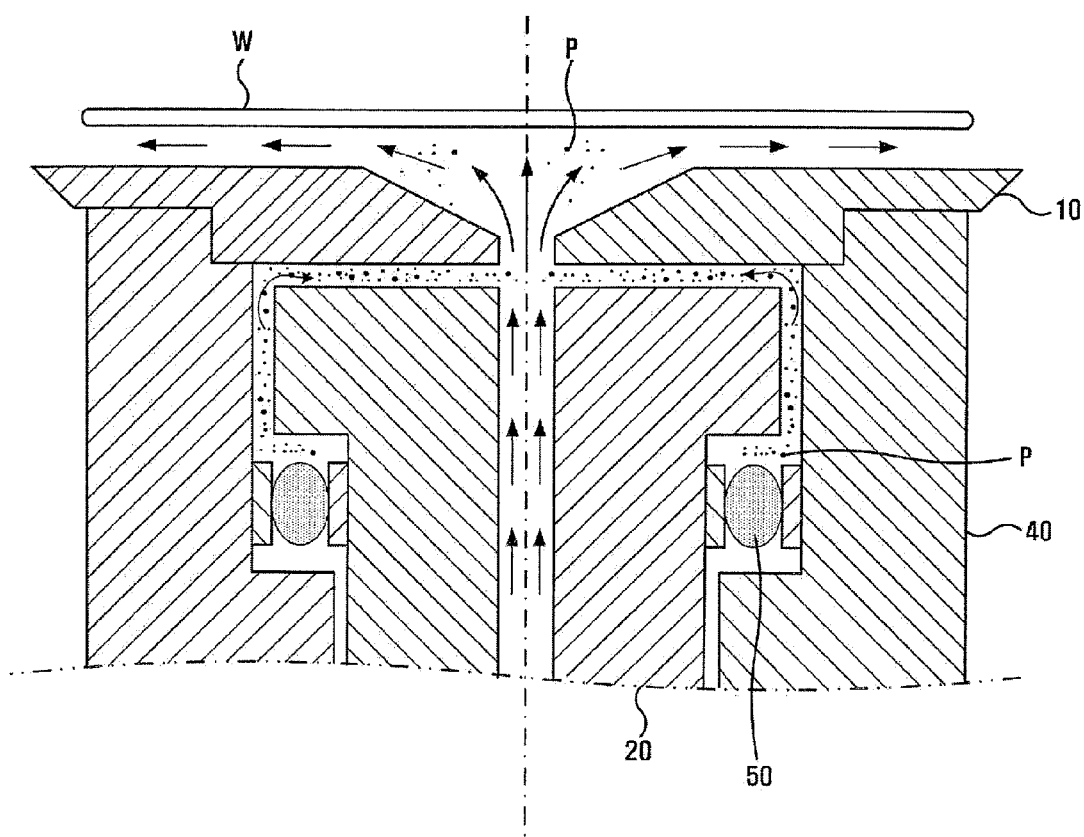
FIG. 1 is a sectional view illustrating a typical spin chuck device.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

Hereinafter, embodiments of the present invention will be described in detail with reference to the attached drawings.

FIG. 1 is a sectional view illustrating a typical spin chuck device.

Referring to FIG. 1, a spin chunk device holds a wafer W and spins the wafer. The spin chunk device provides inert gas such as N2 gas through a central passage. While having the floating the wafer by spraying gas, semiconductor processes such as etching or cleaning can be performed.

For example, the back side of the wafer W can be etched. The device that etches the back side of a wafer is called a back side etcher. When etching the back side of the wafer, a whole surface of the wafer including predetermined patterns can be damaged since the spin body 10 of the spin chunk can touch the whole surface of the wafer. Thus, by supplying inert gas through the center the back side of the wafer can be etched without having the spin body 10 contact the whole surface.

A spin chunk device provides a passage for inert gas and includes a stationary body 20. The stationary body 20 does not spin and can include a gas pump (not shown) to provide the internal passage with inert gas.

The stationary body 20 can be connected to a spin trunk 40 that supports a spin body 10 via a bearing 50. Thus, by using the round-shaped bearing 50, the stationary body 20 remains stationary when the spin trunk 40 spins.

Since the spin trunk 40 and the spin body 10 are connected as one unit, the spin body 10 spins together when the spin trunk 40 spins. The spin trunk 40 spins at a high speed by a driving device (not shown). Thus, the bearing 50 can also spin at a high speed due to the high speed spin of the spin trunk 40, and as a result a particle P can be generated. In addition, a particle can be generated from the stationary body 20 or the spin trunk 40 due to mechanical friction.

The particle P generated can temporarily stay in a space between the stationary body 20 and the spin trunk 40. By the Bernoulli Effect the center pressure of the stationary body 20 is decreased when inert gas penetrates the center of the stationary body 20, and a generated particle can flow in the center of the stationary body 20. Thus, particles can move to the wafer with the inert gas and adhere to the surface of the wafer. As a result, defects of the wafers can be caused due to the unexpected abnormal substances adhering to the wafer. When particles adhere to the whole surface of the wafer, it can cause fatal defects in the fabrication of the semiconductor.

Figure 2:
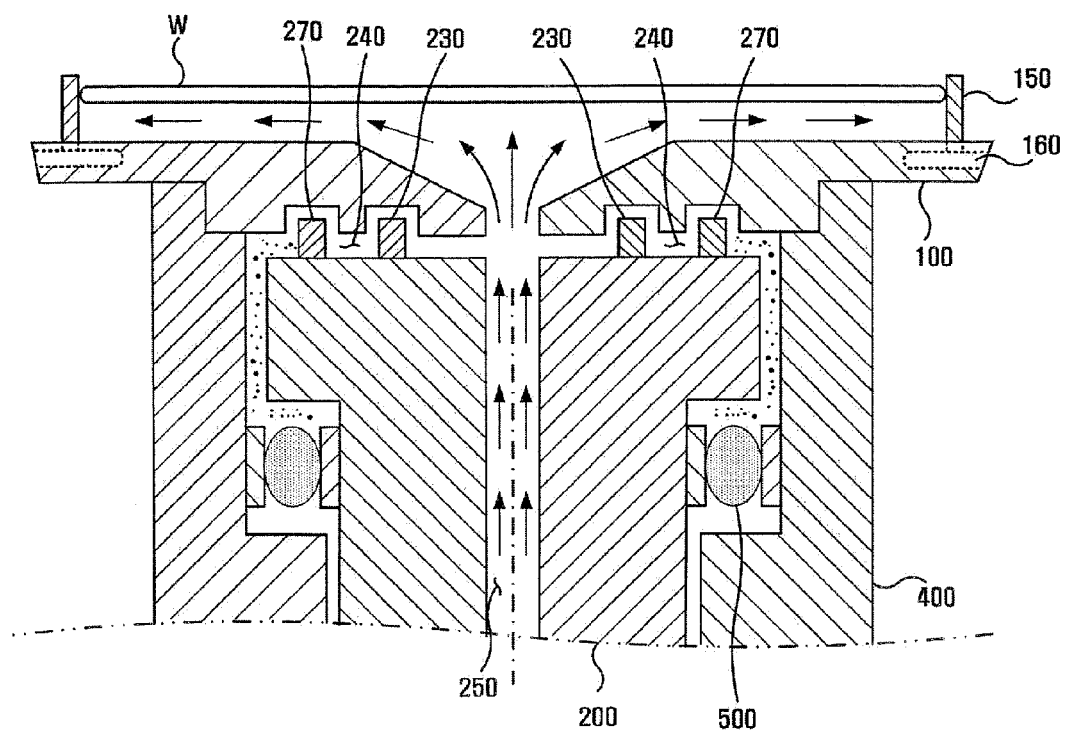
FIG. 2 is a sectional view illustrating a wafer spin chuck device according to an exemplary embodiment of the present invention.
Figure 3:
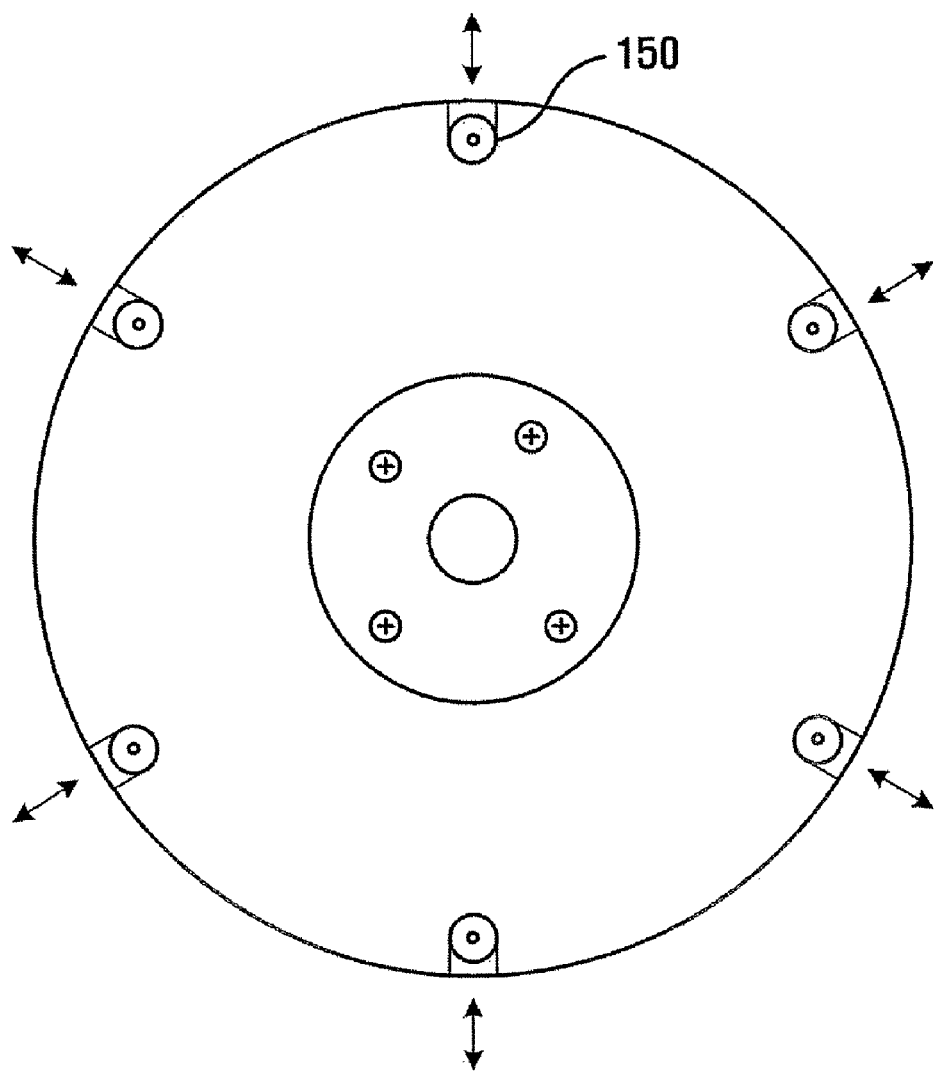
FIG. 3 is a plan view illustrating a wafer spin chuck device according to another exemplary embodiment of the present invention.

FIG. 2 is a sectional view illustrating a wafer spin chuck device according to an exemplary embodiment of the present invention. FIG. 3 is a plan view illustrating a wafer spin chuck device according to another exemplary embodiment of the present invention.

Referring to FIG. 2, a wafer spin chunk device according to an exemplary embodiment of the present invention can include a spin body 100, a stationary body 200, and a spin trunk 400.

The spin body 100 is made in the shape of wheel and spins with a wafer.

The spin body 100 can include a chunk pin 150 at regular intervals to hold a wafer temporarily. Referring to FIG. 3, the chunk pin 150 is placed at the edge of a wafer in a radial shape, and can perform a straight-line motion towards the center. The straight-line motions of the chunk pin 150 above can be implemented using a slider 160.

Referring to FIG. 2, the stationary body 200 is located under the spin body 100 with a space 240 between two bodies. The stationary body 200 is in a standstill state and includes a hollow hole 250 at a center that allows inert gas to pass through.

The space 240 between the stationary body 200 and the spin body 100 can include protrusion parts 230, 270 to block movements of particles composed of fine abnormal substances. The protrusion parts 230, 270 can include more than one protrusion object and are located on the stationary body 200. The protrusion parts 230, 270 can include the protrusion objects having rounded edges, and prevent particles generated from metallic contacts of a bearing 500 from moving to a hollow hole 250.

The spin trunk 400 is connected to the spin body 100 as one unit. The spin body 100 is spinned by a spin of the spin trunk 400. The spin trunk 400 spins at a high speed by a driving device (not shown). The spin trunk 400 is connected to the stationary body 200 via the bearing 500. Thus, due to the bearing 500 the stationary body 200 can remain stationary even though the spin trunk 400 spins.

The operations of a wafer spin chunk device according to an exemplary embodiment of the present invention are described below.

In order to load a wafer on a spin body 100 safely, inert gas is sprayed through a hollow hole 250 of a stationary body 200. While the wafer floats right above the spin body, it is held by moving a chunk pin 150 to a center of the spin body 100.

When a spin trunk 400 spins at a high speed by a driving device (not shown), the spin body 100 connected to the spin trunk 400 as one unit also spins. When the spin body 100 spins, the wafer is spinned by adding power to the wafer with the chunk pin 150 attached to the spin body 100. Here, the spin speed of the wafer can be different from the spin speed of the spin body 100.

A bearing 500 performs a relative motion between the stationary body 200 and the spin trunk 400, and as a result the spin trunk 400 can spin while the stationary body 200 remains motionless. Because the spin trunk 400 spins at a high speed, a particle P, which is an abnormal substance, can be generated by the bearing 500, the stationary body 200, and the spin trunk 400.

The generated particles can move to the low-pressure hollow hole 250, however the particle movement can be blocked by more than one of the protrusion parts 230, 270 according to an exemplary embodiment of the present invention. Thus, by blocking particle movement to the hollow hole 250, particle adhesion to the surface of a wafer can be prevented.

Figure 4:
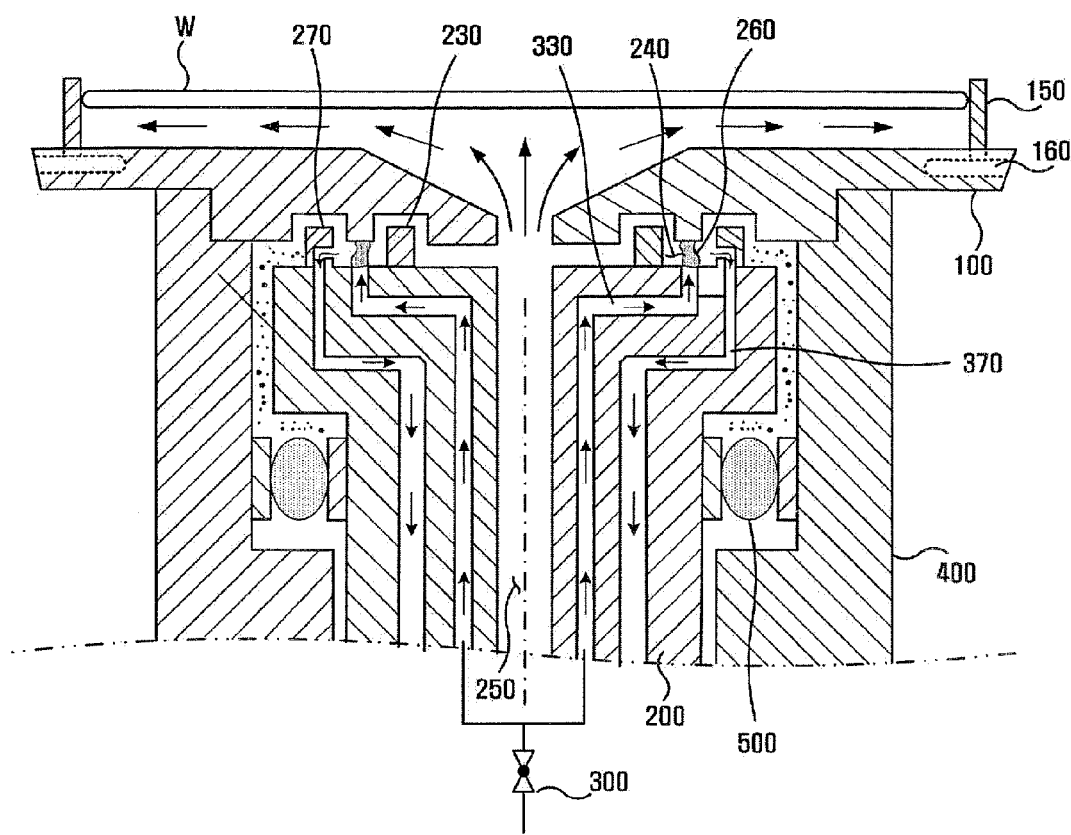
FIG. 4 is a sectional view illustrating a wafer spin chuck device according to another exemplary embodiment of the present invention.

FIG. 4 is a sectional view illustrating a wafer spin chuck device according to another exemplary embodiment of the present invention.

Referring to FIG. 4, a wafer spin chunk device according to another exemplary embodiment of the present invention can include a spin body 100, a stationary body 200, and a spin trunk 400. The stationary body 200 includes a blocking unit which blocks a space 240 between the spin body 100 and the stationary body 200. Since the spin body 100, the stationary body 200, and the spin trunk 400 are described in the previous exemplary embodiment, only the blocking unit is described here.

The blocking unit blocks the space 240 between the spin body 100 and the stationary body 200 by fluid. The blocking unit can form a fluid blocking layer 260 by spraying fluid into the space 240. The fluid above can be liquid or gas including deionized water.

The blocking unit can include a spray route 330 to spray the fluid, a collection route to collect the sprayed fluid, and a pump 300 to provide fluid. Since the blocking unit includes the spray route 330 and the collection route 370 built inside the stationary body 200, the fluid sprayed by the spray route 330 can be collected using the collection route 370.

The fluid blocking layer 260 formed by the fluid sprayed closes the space 240 and blocks the particle movements. As described above, the blocking unit can block particle movements that can be generated in the space 240 between the spin body 100 and the stationary body 200 which are physically separated by forming the fluid blocking layer without a mechanical contact. Therefore, by blocking the particles moving into the hollow holes 250 of the stationary body 200, particles can be prevented from accumulating on the surface of a wafer.

Figure 5:
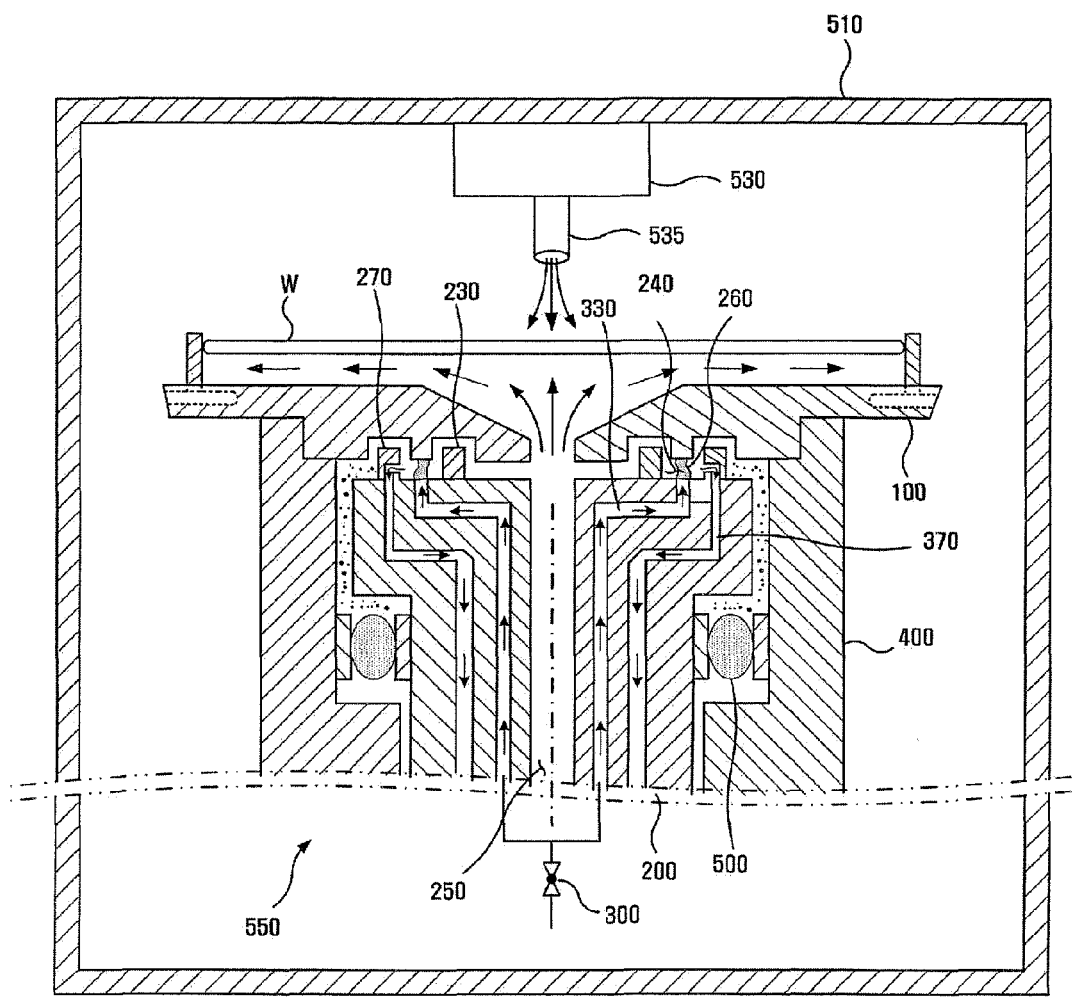
FIG. 5 is a sectional view illustrating a wafer etcher according to another exemplary embodiment of the present invention.

FIG. 5 is a sectional view illustrating a wafer etcher according to another exemplary embodiment of the present invention. Referring to FIG. 5, a wafer etcher according to another exemplary embodiment of the present invention can include a process chamber 510, a wafer spin chunk 550, and a chemical supply unit 530.

The process chamber 510 provides a space for an etching process. The process chamber 510 is composed of a cylinder having a sectional area larger than the size of a substrate or a container having a polygonal sectional view. The process chamber 510 can include a drain (not shown) to discharge remaining substances after etching process.

The chemical supply unit 530 can provide a 00 surface of a wafer with etchant. If the wafer etcher is a back side etcher, the chemical supply unit 530 provides the back of the wafer with etchant. The chemical supply unit 530 is isolated from the wafer and can include more than one chemical injector 535 to supply different types of chemicals according to the wafer.

The wafer spin chunk 550 loads and spins the wafer. The wafer spin chunk 550 can include a spin body 100, a stationary body 200, a spin trunk 400, and a blocking unit. Descriptions of the spin body 100, the stationary body 200, and the spin trunk of the wafer spin chuck 500 are skipped as they are described in the previous exemplary embodiment.

The blocking unit, as illustrated in FIG. 4, sprays fluid into a space 240 between the spin body 100 and the stationary body 200 to form a fluid blocking layer 260 and blocks the space 240. The fluid above can be liquid or gas including deionized water.

The blocking unit is located in the stationary body 200 and can include a spray route 330 which supplies the space 240 with a route to spray the fluid, a collection route 370 which collects the sprayed fluid, and a pump 300 which provides the fluid. Thus, the fluid supplied by the pump 300 flows through the spray route 330 and forms the fluid blocking layer 260 in the space 240. When the fluid is overflowed in the space 240, it is automatically collected through the collection route 370. The collected fluid can be supplied through the spray route 330 again.

As described above, by forming the blocking layer in the space 240 between the stationary body 200 and the spin body 100, particle movements can be prevented. Also, using the rounded-edge protrusion parts 230, 270 particle movements can be physically blocked.

When inert gas is sprayed and moves through the hollow hole 250 of the stationary body 200, the pressure in the hollow hole is decreased by the speed of the inert gas which passes through the hollow hole. As s result, a particle can be absorbed into the hollow hole. However, by forming the fluid blocking layer 260 by the blocking unit and physical walls by the protrusion parts 230, 270, particle movements can be blocked. This can prevent particles from adhering to the surface of a wafer and improve wafer yield.

In addition, if inert gas is not sprayed through the hollow hole 250, the chemical can flow along the space 240 and flow in the area of the bearing 500. In this case, the bearing 500 is corroded and causes difficulties in smooth spin of the spin trunk 500 and high spin by the driving unit (not shown). Thus, forming the fluid blocking layer 260 by the blocking unit can prevent chemicals from flowing in the area of the bearing 500 and corrosion of mechanical operating parts including the bearing 500.

As described above, according to the exemplary embodiment of the present invention by blocking the space between the spin body and the stationary body of a spin chunk by fluid, wafer contamination can be prevented. Also, by blocking contamination materials that can flow in the spin chunk, corrosion of the spin chunk can be prevented.

Although the present invention has been described in connection with the exemplary embodiments of the present invention with reference to the accompanying drawings, it will be apparent to those skilled in the art that various modifications and changes may be made thereto without departing from the scope and spirit of the invention. Therefore, it should be understood that the above embodiments are not limitative, but illustrative in all aspects.

What is claimed is:

1. A wafer spin chuck device comprising:
a spin body which spins a wafer;
a spin trunk connected to the spin body; and
a stationary body connected to the spin trunk via a bearing such that the spin body spins around the stationary body via the bearing, wherein a central passage extends through the spin body and stationary body through which a gas flows to prevent a wafer from contacting a surface of the spin body, and wherein a space exists between the spin body and the stationary body that extends from the bearing to the central passage, wherein the stationary body includes a blocking unit and at least one protrusion part positioned within the space between the bearing and the central passage which blocks the space with a fluid.

2. The wafer spin chuck device of claim 1, wherein the blocking unit blocks the space by spraying deionized water into the space.

3. The wafer spin chuck device of claim 1, wherein the blocking unit includes a spray route which sprays the fluid into the space and a collection route which collects the sprayed fluid through the spray route.

4. The wafer spin chuck device of claim 1, further comprising a driving unit which spins the spin body.

5. The wafer spin chuck device of claim 1, wherein the spin body includes plural chuck pins which hold the wafer.

6. The wafer spin chuck device of claim 5, wherein the chuck pin is located at a circumference side of the spin body and holds the wafer by moving to a center direction.

7. A wafer etcher comprising:
a process chamber which provides a space for an etching process;
a wafer spin chuck which spins a wafer in the process chamber, wherein the wafer spin chuck includes a spin body which spins the wafer while the wafer is floated by inert gas, a spin trunk connected to the spin body, and a stationary body connected to the spin trunk via a bearing such that the spin body spins around the stationary body via the bearing, wherein a central passage extends through the spin body and stationary body through which the inert gas flows, and wherein a space exists between the spin body and the stationary body that extends from the bearing to the central passage, and a blocking unit and at least one protrusion part on the stationary body positioned within the space between the bearing and the central passage which blocks the space with a fluid; and
a chemical supply unit which sprays chemical to a surface of the wafer.

8. The wafer etcher of claim 7, wherein the chemical supply unit sprays the chemical to a backside surface of the wafer.

9. The wafer etcher of claim 7, wherein the blocking unit sprays deionized water to the space to block the space.

10. The wafer etcher of claim 7, wherein the blocking unit includes a spray route which sprays the fluid to the space and a collection route which collects the sprayed fluid through the spray route.

11. The wafer etcher of claim 7, wherein the wafer spin chuck includes a chuck pin which is located at a circumference side of the spin body and holds the wafer by moving to a center direction.

* * * * *